United States Patent
Okunuki

[11] Patent Number: 6,037,601
[45] Date of Patent: Mar. 14, 2000

[54] ELECTRON BEAM ILLUMINATION DEVICE, AND EXPOSURE APPARATUS WITH ELECTRON BEAM ILLUMINATION DEVICE

[75] Inventor: Masahiko Okunuki, Akiruno, Japan

[73] Assignee: Canon Kabushiki Kaisha, Tokyo, Japan

[21] Appl. No.: 09/059,353

[22] Filed: Apr. 14, 1998

[30] Foreign Application Priority Data

Apr. 17, 1997 [JP] Japan .................................. 9-100469

[51] Int. Cl.⁷ ...................................................... H01J 37/30
[52] U.S. Cl. .................................... 250/492.23; 250/398
[58] Field of Search ............................... 250/492.23, 398

[56] References Cited

U.S. PATENT DOCUMENTS

| | | | |
|---|---|---|---|
| 4,812,662 | 3/1989 | Goto et al. ........................... | 250/491.1 |
| 4,894,611 | 1/1990 | Shimoda et al. ..................... | 324/158 R |
| 4,896,045 | 1/1990 | Okunuki et al. ..................... | 250/492.2 |
| 4,897,552 | 1/1990 | Okunuki et al. ..................... | 250/492.2 |
| 4,974,736 | 12/1990 | Okunuki et al. ................... | 219/121.12 |
| 5,434,424 | 7/1995 | Stickel et al. ....................... | 250/492.23 |
| 5,747,819 | 5/1998 | Nakasuji et al. ................... | 250/492.23 |
| 5,821,542 | 10/1998 | Golladay ................................. | 250/398 |

*Primary Examiner*—Jack I. Berman
*Attorney, Agent, or Firm*—Fitzpatrick, Cella, Harper & Scinto

[57] ABSTRACT

An electron beam illumination device has an electron gun for emitting an electron beam, a slit plate formed with a slit opening portion, which has the beam axis of the electron gun as the center, and a deflector for scanning the electron beam along the slit opening portion by deflecting the electron beam, and rotating or reciprocally moving the electron beam to have the beam axis as the center. The electron beam irradiation region on the mask and the exposure region on the wafer can be broadened, and the electron beam can be irradiated onto these regions at uniform irradiation intensity.

16 Claims, 14 Drawing Sheets

ARCUATED ELECTRON BEAM BAND

101 CIRCUIT PATTERN
102 WAFER

ELECTRON BEAM ILLUMINATION DEVICE, AND EXPOSURE APPARATUS WITH ELECTRON BEAM ILLUMINATION DEVICE

BACKGROUND OF THE INVENTION

The present invention relates to an electron beam illumination device used in the lithography process in the manufacture of semiconductor devices, and an exposure apparatus with the electron beam illumination device.

Conventionally, in the lithography process in mass-production of semiconductor devices, an exposure technique based on light exposure is used. However, in recent years, as semiconductor devices continue to have a higher degree of integration, the line width in the device is shrinking. Especially, in semiconductor memory devices such as 1 G and 4 G DRAMs the line width is 0.2 μm or less, which is considerably small. As an alternative exposure technique to light exposure, an exposure apparatus using electron beams with higher resolution is beginning to gain attention.

However, existing electron beam exposure apparatuses mainly use a Gaussian method and variable forming method using a single beam, and require much time in the lithography process in the manufacture of semiconductor devices. Hence, owing to low productivity of semiconductor devices, the electron beam exposure apparatus is used in only limited applications that particularly require its excellent resolution performance, such as mask drawing, study and development of VLSIs, exposure of ASIC devices that are produced in small quantity, and the like. For this reason, improvements in the productivity of semiconductor devices are a major problem upon applying the electron beam exposure apparatus to the mass-production of semiconductor devices.

As a means for solving the above problem, in recent years, so-called stepping transfer has been proposed. FIG. 17 is a perspective view showing an exposure apparatus using conventional stepping transfer. In the stepping transfer, as shown in FIG. 17, circuit patterns 101 to be repetitively formed on a wafer 102 are formed into cells, thereby improving productivity upon drawing interconnect patterns on the wafer 102 by exposure.

Since the maximum region of the wafer that can be exposed at one time using the stepping transfer is as small as about several μm as in the variable forming method, a plurality of (e.g., two or three) deflectors must be used, and chromatic aberrations, distortion, and the like produced upon deflection must be removed using an MOL (movable objective lens system) to obtain a wider exposure region. In order to improve the productivity of semiconductor devices, it is again required to broaden the exposure region. However, it is hard to broaden the exposure region while maintaining both high overlay accuracy of exposure regions and high exposure resolution. For example, when the overlay accuracy of exposure regions ranges from 20 to 30 nm, and the exposure resolution is 0.2 μm or less, the exposure region can be broadened to about 1 mm by deflection.

As described above, in the conventional electron beam exposure apparatus, since the region of the wafer that can be exposed at one time is smaller than the entire region to be exposed on the wafer, means for scanning an electron beam or reciprocally moving a stage that carries a wafer or exposure mask is used to expose the entire region to be exposed on the wafer.

However, as described above, since the exposure region of the electron beam is smaller than the region to be exposed on the wafer, the wafer must be reciprocally moved many times or the electron beam must be repetitively scanned to expose the entire region to be exposed on the wafer. For this reason, a longer wafer exposure time is required than a light exposure type exposure apparatus.

In order to shorten the wafer exposure time, at least one of means for increasing the scanning speed of the electron beam or the moving speed of the stage that carries the wafer or exposure mark, and means for broadening the exposure region of the electron beam is required.

However, with the means for increasing the scanning speed of the electron beam or the moving speed of the stage, the amount of irradiated electron beam may become short, and the wafer may not be sufficiently exposed. In such case, the irradiation intensity of the electron beam may be increased, but then the exposure image is blurred.

On the other hand, with the means for broadening the exposure region of the electron beam, the electron beam must be irradiated at a uniform intensity within the exposure region so as to obtain a uniform line width on the wafer. However, the exposure region on the wafer by a single electron beam is as small as several μm, and even when a conventional emittance LaB6 electron gun having a deflector is used, the emittance value (the product of the crossover and electron beam output angle) is as low as about several 10 μm mrad. For this reason, when a conventional electron beam illumination system is used, it is difficult to further broaden the exposure region and to uniformly irradiate the electron beam onto that exposure region.

SUMMARY OF THE INVENTION

It is, therefore, an object of the present invention to provide an electron beam illumination device, which can uniformly illuminate an electron beam onto an exposure region while broadening that exposure region. It is another object of the present invention to provide an exposure apparatus which can decrease the number of exposure scans onto the wafer and can shorten the exposure time using such electron beam illumination device.

In order to achieve the above objects, an electron beam illumination device according to the present invention comprises an electron gun for emitting an electron beam, a slit plate unit formed with an arcuated slit opening portion which has as the center an extending line of a path of the electron beam emitted by the electron gun, and deflection means for scanning the electron beam along the slit opening portion by deflecting the electron beam emitted by the electron gun before the electron beam is irradiated onto the slit plate unit, and rotating or reciprocally moving the electron beam to have as the center the extending line of the path of the electron beam.

With this arrangement, of the electron beam scanned along the slit opening portion, the electron beam that has passed through the slit opening portion forms an arcuated electron beam band, thus broadening the illumination region.

According to a preferred aspect of the present invention, a speed of the electron beam that scans the slit opening portion makes an irradiation intensity of an arcuated electron beam band formed when the electron beam has passed through the slit opening portion uniform in the entire arcuated electron beam band. Hence, thermal strain of a mask and wafer irradiated with the electron beam can be reduced.

Also, according to a preferred aspect of the present invention, the slit plate unit comprises a convex blade formed with an arcuated convex edge, and a concave blade formed with an arcuated concave edge having the same diameter as a diameter of the convex edge, the slit opening portion is defined by disposing the convex and concave blades with the arcuated edges thereof opposing each other, and at least one of the convex and concave blades is attached with a drive unit for adjusting a spacing between the convex and concave blades, thereby adjusting the arc width of the arcuated electron beam band. By controlling the arc width, the irradiation intensity of the arcuated electron beam band can be finely adjusted, and the resolution of a pattern image can also be adjusted.

In addition, according to a preferred aspect of the present invention, the slit plate unit comprises a light-shielding blade for adjusting a length of the slit opening portion defined by the convex and concave blades, thereby adjusting the arc length of the arcuated electron beam band. Hence, the arc length can be optimally set in correspondence with the size of the region to be exposed.

Furthermore, according to a preferred aspect of the present invention, the center of rotation or reciprocal movement of the electron beam that scans the slit opening portion is shifted from the center of the slit opening portion along the central axis of the slit opening portion by the deflection means, thereby adjusting the arc width of the arcuated electron beam band, since the electron beam that scans the slit opening portion hits only one edge of the slit opening portion and the arc width of the arcuated electron beam band is decreased.

According to a preferred aspect of the present invention, an exposure apparatus of the present invention, which comprises an illumination device for projecting a circuit pattern drawn on the mask onto a wafer, and projects the circuit pattern onto the wafer by exposure while synchronously moving the wafer and mask, uses one of the electron beam illumination devices of the present invention as the illumination device.

According to a preferred aspect of the present invention, a scanning cycle of the electron beam onto the slit opening portion is a cycle which is shorter than a moving time of the mask by a distance equal to a width of the arcuated electron beam band when the arcuated electron beam band formed by the electron beam that has passed through the slit opening portion is projected onto the mask, and is a divisor of the moving time, thereby preventing exposure errors such as formation of non-exposed portions, double exposure, and the like of the wafer.

Moreover, according to a preferred aspect of the present invention, since the exposure apparatus further comprises an electron detection unit for detecting an electron emitted by the mask irradiated with the electron beam, and a blanking electrode unit for controlling irradiation of the electron beam onto the mask on the basis of information obtained from the electron detection unit, the electron beam can be prevented from being unnecessarily irradiated onto a portion without any circuit pattern on the mask, thus preventing thermal strain of the mask.

Lastly, according to a preferred aspect of the present invention, since the exposure apparatus further comprises mask reference mark detection means for detecting a position reference mark formed on the mask, and wafer reference mark detection means for detecting a position reference mark formed on the wafer, the position reference mark positions formed on the mask and wafer can be detected. The mask and wafer are moved relative to each other based on the detection results, thus aligning them.

BRIEF DESCRIPTION OF THE DRAWINGS

The accompanying drawings, which are incorporated in and constitute a part of the specification, illustrate embodiments of the invention, and together with the description, serve to explain the principles of the invention.

DETAILED DESCRIPTION OF THE INVENTION

Preferred embodiment of the present invention will be described in detail in accordance with the accompanying drawings.

Figure 1:
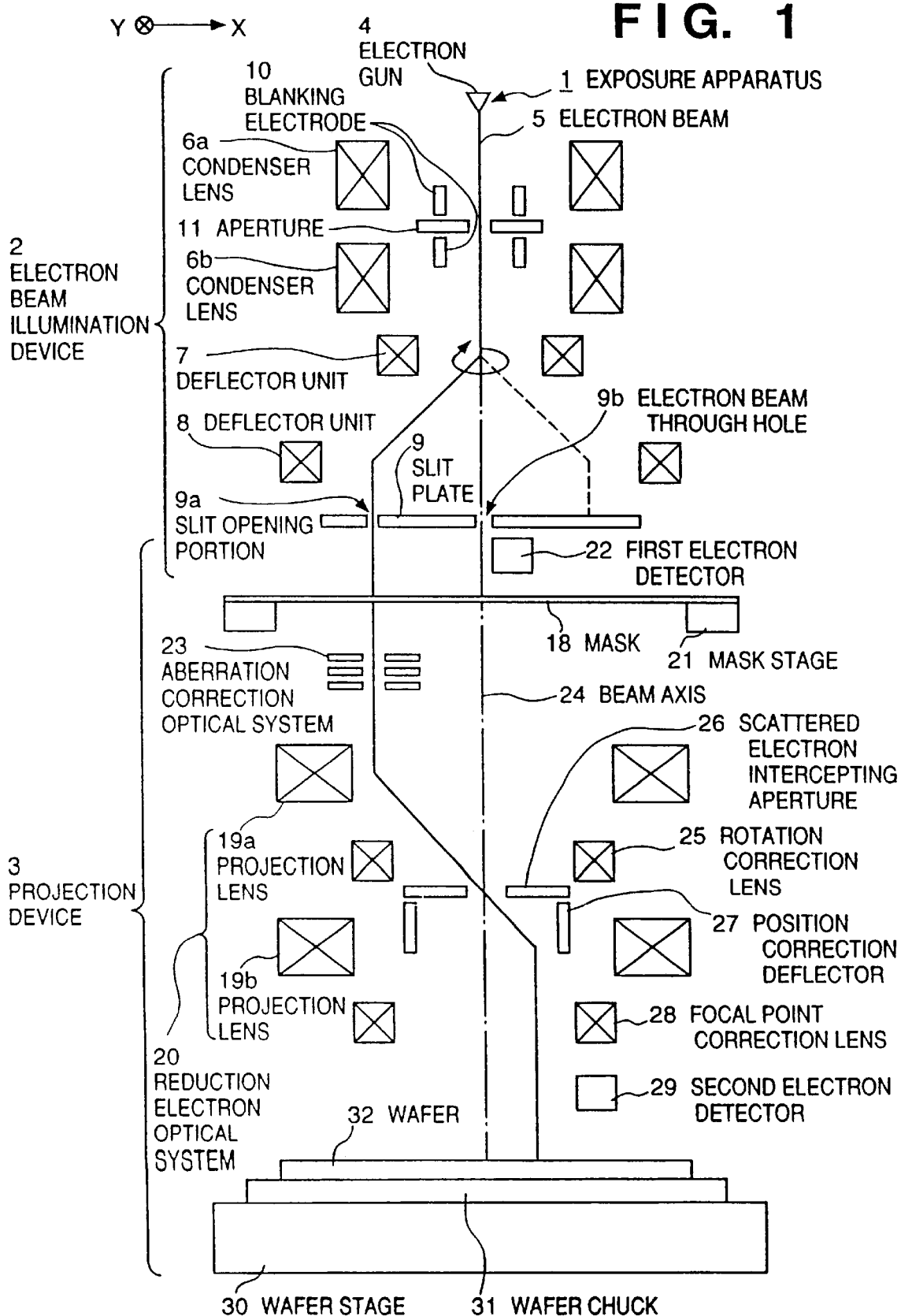
FIG. 1 is a view showing the overall arrangement of an exposure apparatus according to an embodiment of the present invention.

FIG. 1 shows the overall arrangement of an exposure apparatus according to an embodiment of the present invention. As shown in FIG. 1, an exposure apparatus 1 of this embodiment comprises an electron beam illumination device 2 as an illumination source of an electron beam 5, and a projection device 3 for projecting an electron beam coming from the electron beam illumination device 2 onto a wafer 32.

Figure 2:
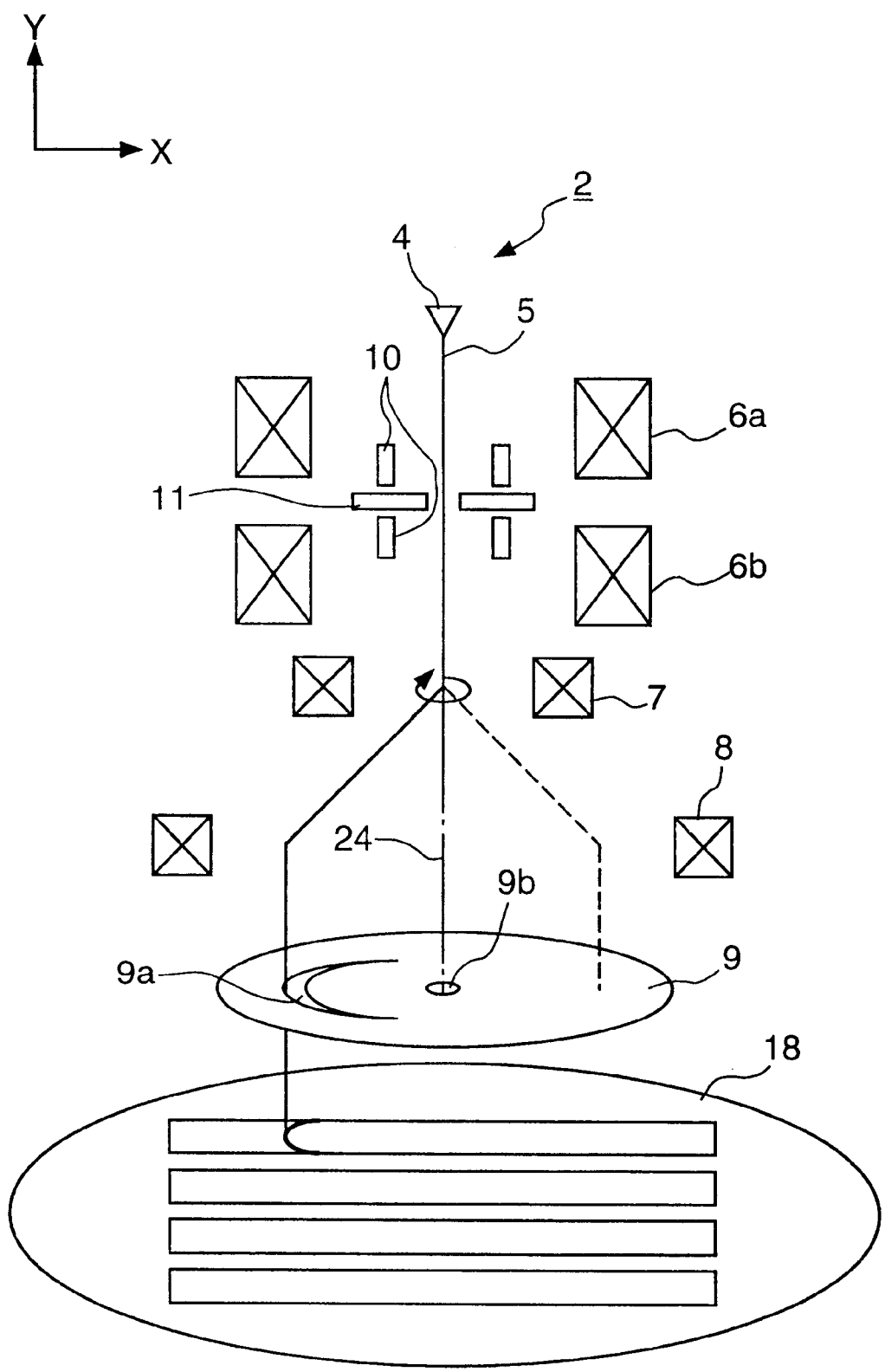
FIG. 2 is a view showing the overall arrangement of an electron beam illumination device shown in FIG. 1.

The electron beam illumination device will be explained below with reference to FIGS. 1 and 2. FIG. 2 shows the overall arrangement of the electron beam illumination device shown in FIG. 1.

As shown in FIGS. 1 and 2, the electron beam illumination device 2 has an electron gun 4 for irradiating an electron beam 5, condencer lenses 6a and 6b for converging the electron beam 5 emitted by the electron gun 4, magnetic or electric field type deflector units 7 and 8 for deflecting the electron beam 5, and a slit plate 9 formed with an arcuated slit opening portion 9a and an electron beam through hole 9b. Note that the slit opening portion 9a is an arcuated slit having a beam axis 24 (i.e., the extending line of the path of the electron beam 5 emitted by the electron gun 4) of the electron beam illumination device 2 as the center, and the electron beam through hole 9b is formed on the beam axis 24 of the electron beam illumination device 2. Furthermore, a blanking electrode 10 for suppressing irradiation of the electron beam 5, and an aperture 11 for helping to converge the electron beam at the condencer lenses 6a and 6b are inserted between the condencer lenses 6a and 6b as needed.

Figure 3:
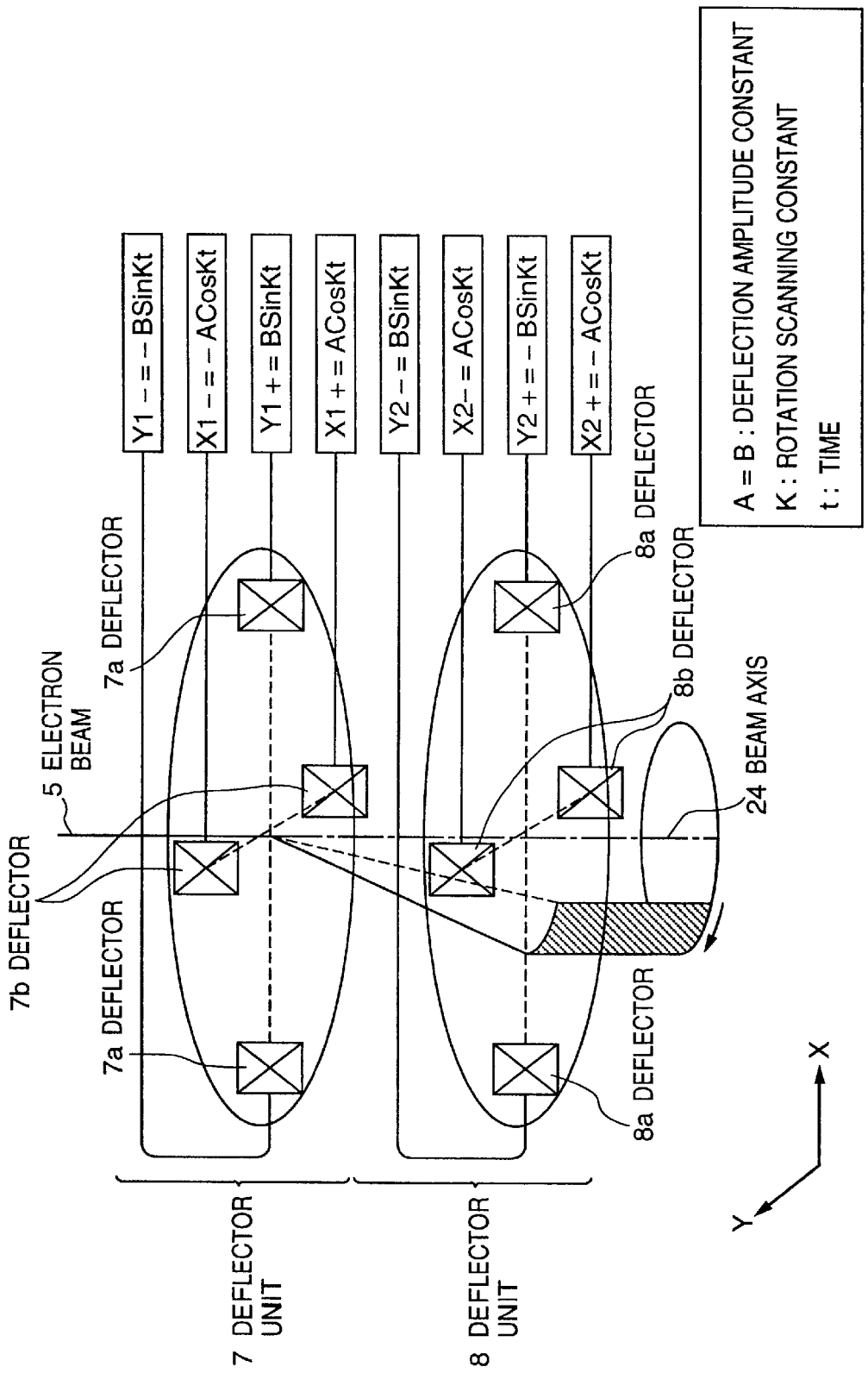
FIG. 3 is a view showing the arrangement of deflector units in the electron beam illumination device shown in FIG. 2 in more detail.

As shown in FIG. 3, the deflector units 7 and 8 respectively comprise four deflectors 7a, 7b, 8a, and 8b, i.e., the deflectors 7a and 8a which face each other in the X-direction, and the deflectors 7b and 8b which face each other in the Y-direction. In the upper deflector unit 7, sine components of a deflection signal are input to the deflectors 7a facing each other in the X-direction, and cosine components of the deflection signal are input to the deflectors 7b facing each other in the Y-direction. In the lower deflector unit 8 as well, sine components of a deflection signal are input to the deflectors 8a facing each other in the X-direction, and cosine components of the deflection signal are input to the deflectors 8b facing each other in the Y-direction.

With this arrangement, as shown in FIGS. 1 and 2, the deflector units 7 and 8 rotate the electron beam 5, that has been converged by the condencer lenses 6a and 6b, about the beam axis 24 of the electron beam illumination device 2, and scan the beam 5 along the slit opening portion 9a.

Figure 4:
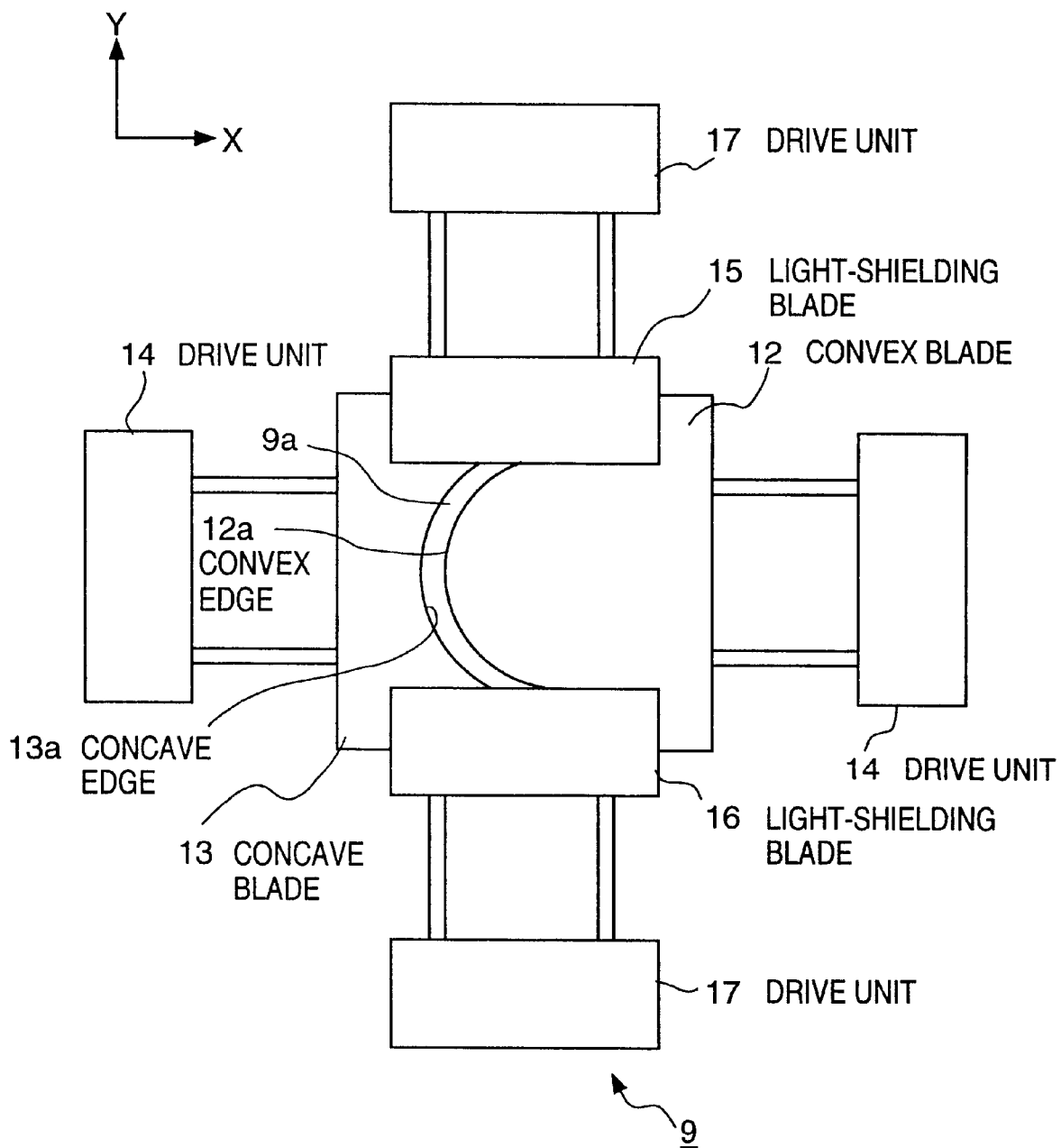
FIG. 4 is a top view showing the arrangement of a slit plate in the electron beam illumination device shown in FIG. 2 in detail.

FIG. 4 shows the arrangement of the slit plate in the electron beam illumination device shown in FIG. 2 in detail.

As shown in FIG. 4, a convex blade 12 formed with an arcuated convex edge 12a, and a concave blade 13 having an arcuated concave edge 13a, which has the same diameter as that of the arc of the convex edge 12a, are disposed so that their arcuated edges 12a and 13a oppose each other, thus defining a constant slit width of the slit opening portion 9a. Drive units 14 for driving the convex and concave blades 12 and 13 in the X-direction are attached to these blades. Hence, when at least one of the convex and concave blades 12 and 13 is driven by operating the drive units 14, the arc width of the arcuated electron beam band can be adjusted.

Light-shielding blades 15 and 16 for adjusting the length of the slit opening portion 9a are arranged above (front side in FIG. 4) the convex and concave blades 12 and 13. Drive units 17 for moving the light-shielding blades 15 and 16 are respectively attached to these blades. When the light-shielding blades 15 and 16 are moved by operating the drive units 17, the length of the slit opening portion 9a can be adjusted. Hence, the slit length of the slit opening portion 9a can be optimally set in correspondence with the size of the region to be exposed on the wafer 32 (see FIG. 1), thus adjusting the arc length of the arcuated electron beam band.

The arrangement of the projection device 3 will be explained below with the aid of FIG. 1 again.

As shown in FIG. 1, the projection device 3 has a mask 18 on which a circuit pattern (not shown) is formed by electron beam transmission and non-transmission portions, and a reduction electron optical system 20 made up of projection lenses 19a and 19b for forming a pattern image defined by the electron beam 5 transmitted through the circuit pattern onto the wafer 32.

As the mask 18, either a scattering type mask prepared by forming a scattering pattern for scattering the electron beam 5 on a membrane that transmits the electron beam 5, or a stencil type mask prepared by forming an absorbing pattern for intercepting or attenuating the electron beam 5 may be used. The mask 18 of this embodiment uses the scattering type mask. The mask 18 is placed on a mask stage 21 which is movable at least in the X- and Y-directions.

In the projection device 3, a first electron detector 22 for detecting secondary electrons or reflected electrons emitted by the mask when the electron beam 5 is irradiated onto the mask 18 is disposed near the mask 18. An aberration correction optical system 23 for correcting in advance aberrations (especially, astigmatism) produced when the electron beam 5 passes through the reduction electron optical system 20 is inserted between the mask 18 and the upper projection lens 19a.

Also, a rotation correction lens 25 for rotating the electron beam 5 about the beam axis 24 as the center, a scattered electron intercepting aperture 26 for intercepting the electron beam 5 that has been transmitted through and scattered by the scattering pattern on the mask 18, and transmitting the electron beam 5 that has been transmitted through a portion other than the scattering pattern, and a position correction deflector 27 for correcting the position of the pattern image to be projected onto the wafer 32 are interposed between the projection lenses 19a and 19b.

Furthermore, a focal point correction lens 28 for correcting the focal point of the reduction electron optical system 20 is disposed beneath the reduction electron optical system 20, and a second electron detector 29 for detecting secondary electrons and reflected electrons emitted by the wafer 32 upon irradiation of the electron beam 5 onto the wafer 32 is disposed near the wafer 32.

A wafer chuck 31 that fixes the wafer 32 is placed on a wafer stage 30 which is movable in the X- and Y-directions, and is rotatable in the X-Y plane. The wafer 32 is placed on the wafer chuck 31.

Figure 5:
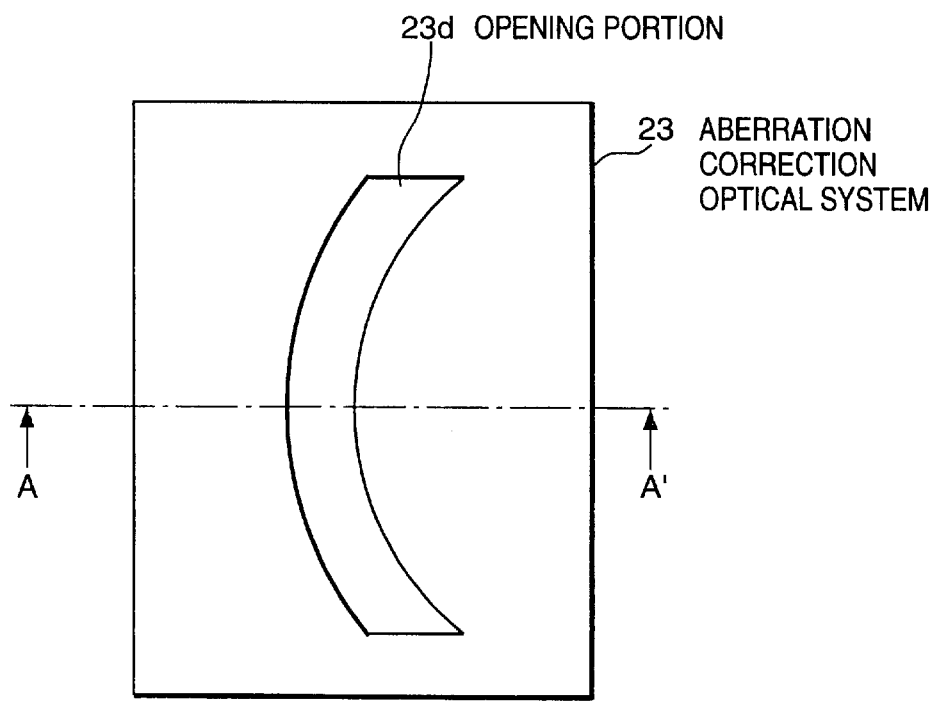
FIG. 5 is atop view of an aberration correction optical system of a projection device shown in FIG. 1.

The arrangement of the aberration correction optical system 23 will be described in detail below with reference to FIGS. 5 and 6. FIG. 5 is a top view of the aberration correction optical system shown in FIG. 1, and FIG. 6 is a sectional view of the aberration correction optical system taken along a line A—A in FIG. 5.

As shown in FIG. 5, the aberration correction optical system 23 is formed with an arcuated opening portion 23d having the beam axis 24 (see FIG. 1) as the center like the slit opening portion 9a (see FIG. 1) of the slit plate 9. The arcuated opening portion 23d is formed at a position where it does not intercept the electron beam 5 that has been transmitted through the slit plate 9 and mask 18 (see FIG. 1).

Figure 6:
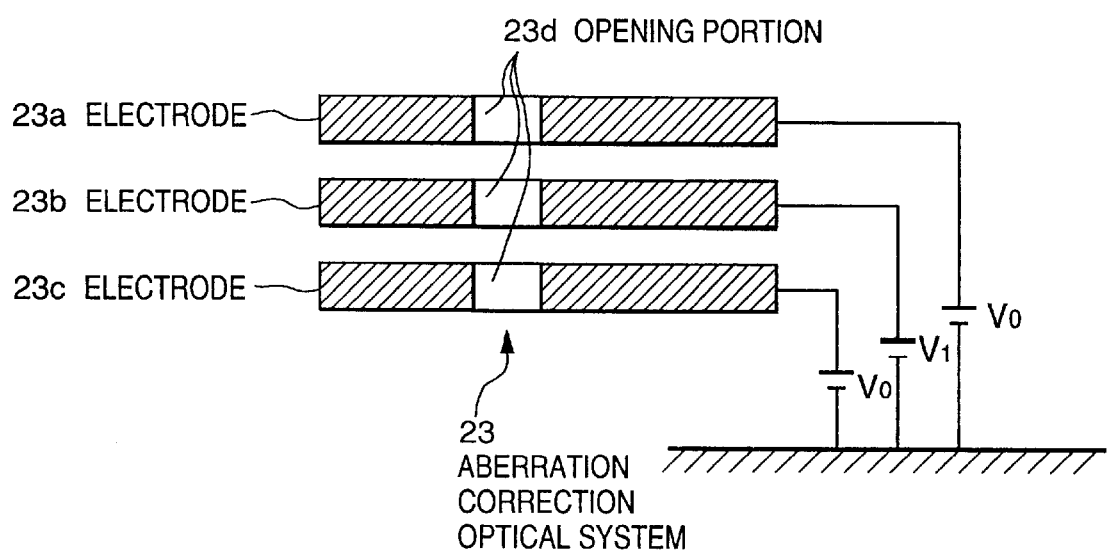
FIG. 6 is a sectional view of the aberration correction optical system taken along a line A—A in FIG. 5.

As shown in FIG. 6, the aberration correction optical system 23 comprises a unipotential lens made up of three electrodes 23a, 23b, and 23c. The electrodes 23a and 23c are set at the same potential $V_0$ as that of an acceleration electrode (not shown), and the middle electrode 23b between the two electrodes 23a and 23c is set at a potential $V_1$ different from $V_0$. With this arrangement, the aberration correction optical system 23 serves as an electron lens, which has different divergence or convergence effects (i.e., different focal lengths) in the circumferential and radial directions of the arcuated opening portion 23d. Note that the aberration correction optical system 23 of this embodiment uses the unipotential lens made up of the three electrodes 23a, 23b, and 23c, as described above, but may use an electron lens made up of a single electrode as long as it can accelerate or decelerate the electron beam that has been transmitted through the slit plate and mask, and can have different divergence or convergence effects in the circumferential and radial directions of the arcuated opening portion.

Figure 7:
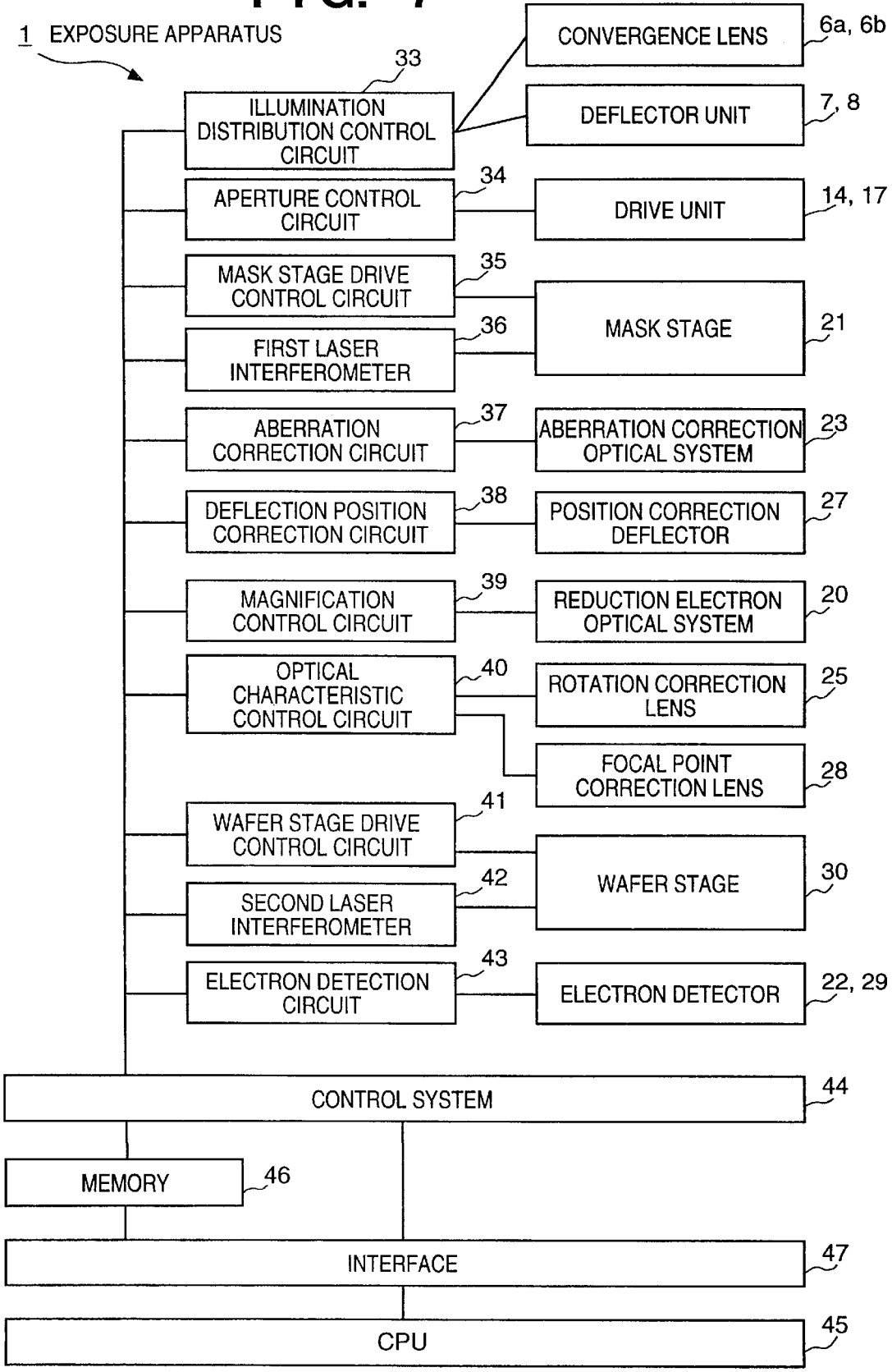
FIG. 7 is a block diagram showing the arrangement of principal part of the exposure apparatus according to the embodiment of the present invention.

FIG. 7 is a block diagram showing the arrangement of principal part of the exposure apparatus according to the embodiment of the present invention.

As shown in FIG. 7, the exposure apparatus 1 comprises an illumination distribution control circuit 33 for controlling the condencer lenses 6a and 6b, and deflector units 7 and 8, an aperture control circuit 34 for controlling the drive units 14 and 17 that move the blades 12, 13, 15, and 16 shown in FIG. 4, a mask stage drive control circuit 35 for controlling the movement of the mask stage 21, a first laser interferometer 36 for measuring the position of the mask stage 21 in real time, an aberration control circuit 37 for controlling the aberration correction characteristics of the aberration correction optical system 23, and a deflection position correction circuit 38 for controlling the position correction deflector 27 that corrects the position of the pattern image to be projected onto the wafer 32.

Also, the exposure apparatus 1 comprises a magnification control circuit 39 for controlling the reduction magnification of the reduction electron optical system 20, an optical characteristic control circuit 40 for controlling the rotation correction lens 25 and focal point correction lens 28 which adjust the optical characteristics such as the focal point position, image rotation, and the like, a wafer stage drive control circuit 41 for controlling the movement of the wafer stage 30, a second laser interferometer 42 for measuring the position of the wafer stage 30 in real time, and an electron detection circuit 43 for transferring the detection signals detected by the electron detectors 22 and 29 to a control system 44 (to be described below).

Furthermore, the exposure apparatus 1 comprises the control system 44 for controlling the above-mentioned circuits, a CPU 45 for systematically controlling the above-mentioned circuits via the control system 44, a memory 46 for storing control data for the control system 44, and an interface 47 serving as an information transmission medium between the CPU 45 and control system 44.

The operation of the electron beam illumination device 2 will be explained below mainly using FIGS. 1, 8, and 9.

The electron beam 5 emitted by the electron gun 4 is adjusted by the condencer lenses 6a and 6b to converge on the mask 18. The electron beam 5 is deflected by the deflector unit 7, and enters the lower deflector unit 8 in a direction to separate from the beam axis 24. The electron beam 5 is deflected again by the deflector unit 8, passes through the slit opening portion 9a of the slit plate 9, and strikes the mask 18 perpendicularly. As has been described above with the aid of FIG. 3, the deflectors 7a, 7b, 8a, and 8b of the deflector units 7 and 8 receive the deflection signals so as to rotate the electron beam 5 about the beam axis 24. Hence, since the electron beam 5 rotates about the beam axis 24 while scanning the slit opening portion 9a, as shown in FIG. 8, the electron beam 5 that has passed through the slit opening portion 9a artificially forms an arcuated electron beam band.

Figure 9:
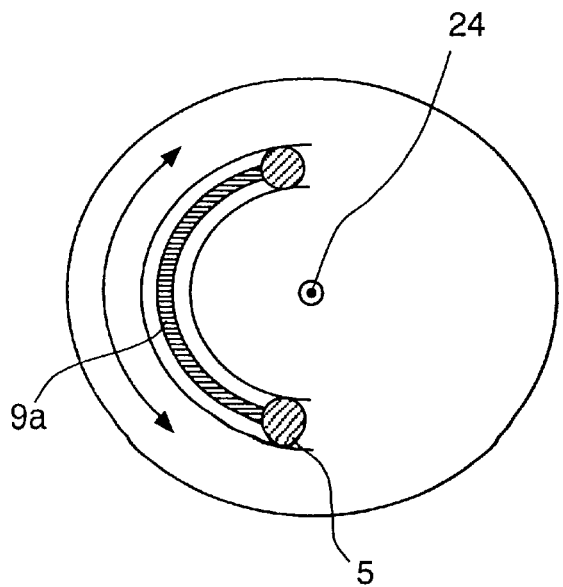
FIG. 9 is a top view showing an electron beam which is scanning the slit opening.

Alternatively, as shown in FIG. 9, an arcuated electron beam band may be formed by controlling the deflection of the electron beam 5 so that the electron beam 5 reciprocally scans the slit opening portion 9a to have the beam axis 24 as the center. However, in this case, the electron beam scanning speed on the slit opening portion 9a may not become constant due to the hysteresis of the deflector units 7 and 8 (see FIG. 1). For this reason, in order to reliably form an arcuated electron beam band with a uniform irradiation intensity of the electron beam 5, the electron beam 5 is preferably rotated and scanned, as described above.

The arc width of the arcuated electron beam band can be adjusted by the condencer lenses 6a and 6b, and is preferably adjusted to fall within the range from several $\mu$m to several hundred $\mu$m on the mask 18.

Upon scanning of the electron beam 5, the mask 18 and wafer 32 may suffer thermal strain. However, such thermal strain can be eliminated by scanning the slit opening portion 9a at a scanning speed thermally equivalent to that in a case wherein the entire slit opening portion 9a is simultaneously irradiated with the electron beam, i.e., at a scanning speed at which the irradiation intensity of the electron beam 5 becomes thermally uniform on the entire arcuated electron beam band. Note that the scanning speed is preferably equal to or lower than about several $\mu$sec.

As described above, since the arcuated electron beam band is artificially formed by scanning the electron beam 5 along the slit opening portion 9a at high speed, even when a single electron beam or a conventional emittance LaB6 electron gun is used, the irradiation region of the electron beam 5 on the mask 18 and the exposure region on the wafer 32 can be broadened, and the electron beam 5 can be irradiated onto these regions at uniform irradiation intensity.

Figure 8:
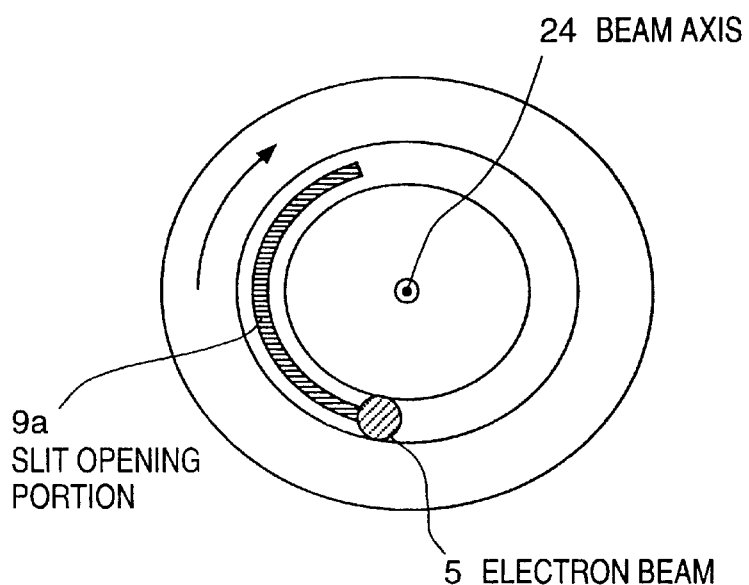
FIG. 8 is a top view showing an electron beam which is scanning a slit opening.
Figure 10:
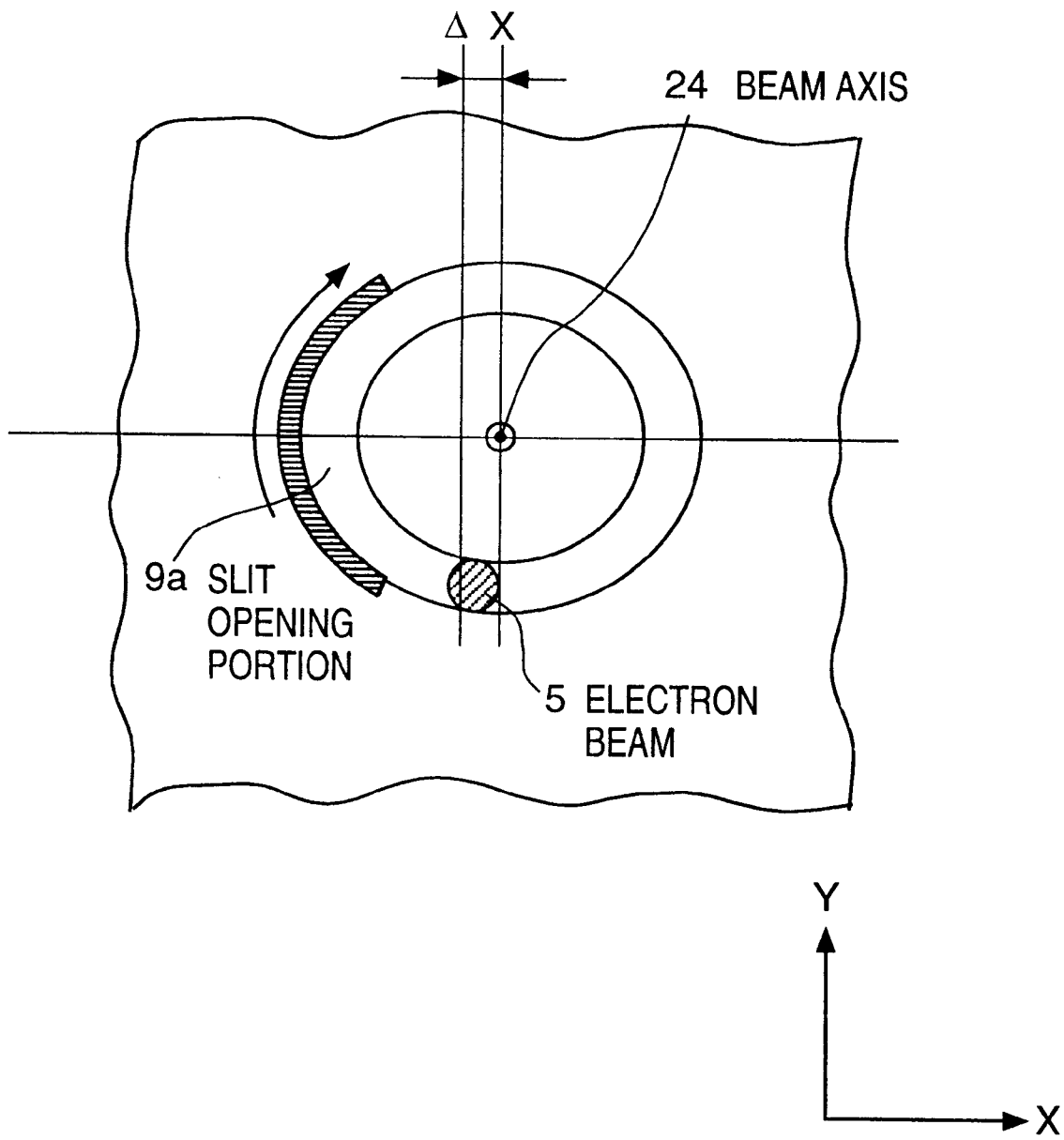
FIG. 10 is a top view showing an electron beam which is scanning the slit opening.

In the above-mentioned electron beam illumination device 2, as shown in FIG. 8, since the electron beam 5 is scanned to extend on the edges on both sides of the slit opening portion 9a, the arc width of the arcuated electron beam band formed via the slit opening portion 9a depends on the slit width of the slit opening portion 9a. Hence, the arc width of the arcuated electron beam band is adjusted by changing the spacing between the convex and concave blades 12 and 13. In place of changing the spacing between the convex and concave blades 12 and 13, an offset signal may be input to the lower deflector unit 8 to shift the center of rotation of the electron beam 5 by $\Delta x$ in the X-direction of the central axis of the slit opening portion 9a, so that the electron beam 5 scans only one edge of the slit opening portion 9a, as shown in FIG. 10. When the arc width of the arcuated electron beam band is controlled by scanning the electron beam 5 in such way, reduction adjustment of the irradiation intensity of the arcuated electron beam band can be attained, and the resolution of the pattern image can also be adjusted.

The operation of the exposure apparatus 1 of this embodiment will be explained below.

Figure 11:
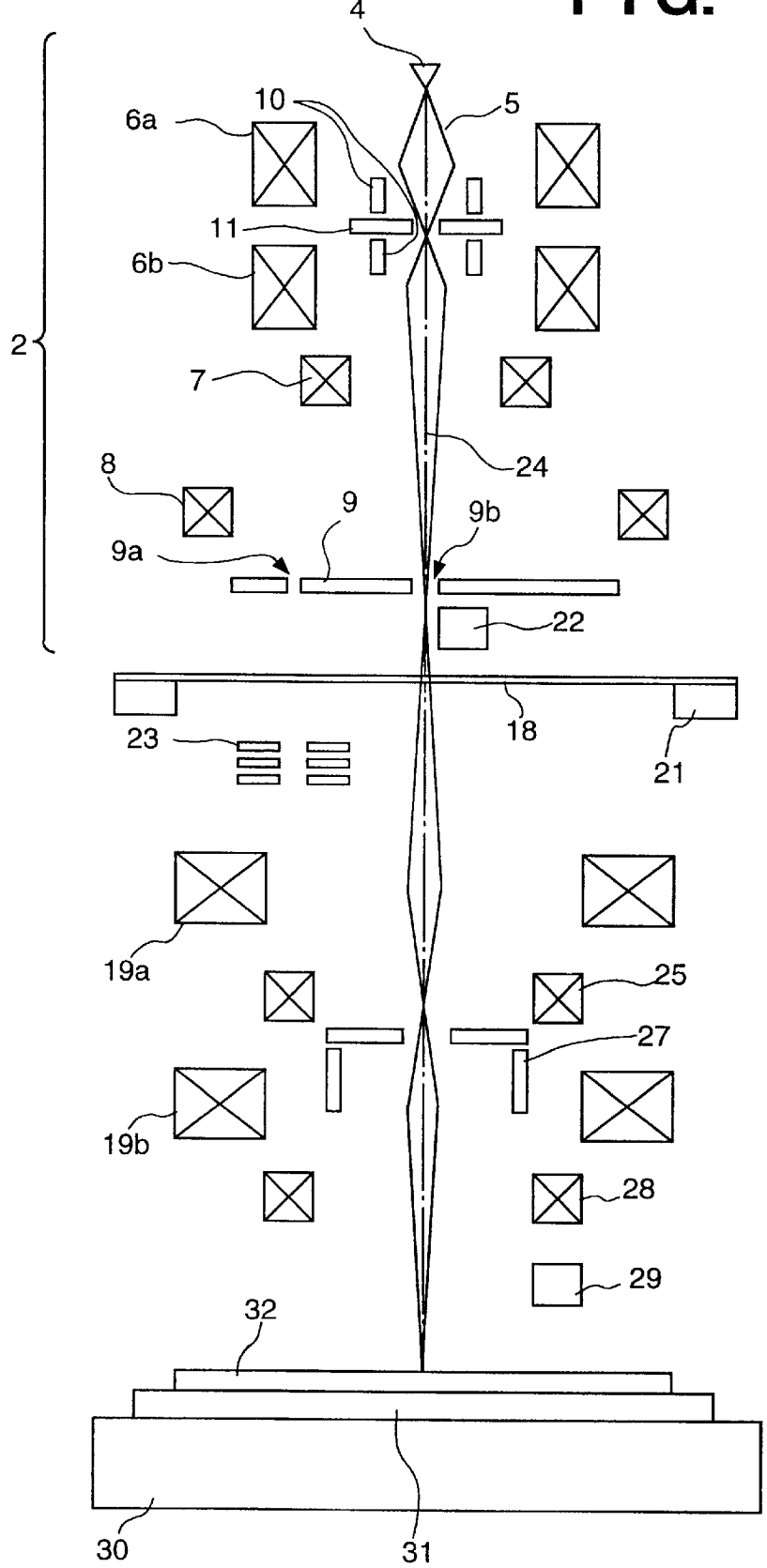
FIG. 11 is a view showing the overall arrangement of an exposure apparatus to explain alignment of a mask and wafer with respect to the beam axis of the electron beam illumination device.

Alignment of the mask 18 and wafer 32 with respect to the beam axis 24 of the electron beam illumination device 2 will be explained below with reference to FIG. 11.

Initially, the electron beam 5 is emitted by the electron gun 4, and is converged on the mask 18 by the condencer lenses 6a and 6b. At this time, the electron beam 5 passes through the electron beam through hole 9b formed on the slit plate 9. Subsequently, the electron beam 5 is scanned along the slit opening portion 9a by the deflector units 7 and 8, and secondary electrons or reflected electrons emitted by the mask 18 irradiated with the electron beam 5 are detected by the first electron detector 22. With such mask reference mark detection means, position reference marks (not shown) formed on the mask 18 are detected.

The mask 18 is removed from the position on the beam axis 24, and the electron beam 5 is converged on the wafer 32 by the projection lenses 19a and 19b. Subsequently, the electron beam 5 is deflected by the position correction deflector 27 to scan the wafer 32, and secondary electrons or reflected electrons emitted by the wafer 32 are detected by the second electron detector 29. With such wafer reference mark detection means, position reference marks (not shown) formed on the wafer 32 are detected.

By aligning the mask stage 21 or wafer stage 30 on the basis of the position information of the detected position reference marks, the mask 18 and wafer 32 are aligned with the beam axis 24 of the electron beam illumination device 2.

The exposure operation of the exposure apparatus 1 will be explained below mainly using FIGS. 1 and 7.

Upon reception of an "exposure" command from the CPU 45, the control system 44 operates the drive units 14 and 17 via the aperture control circuit 34, thus moving the blades 12, 13, 15, and 16 (FIG. 4). With this control, the slit width and length of the slit opening portion 9a are set in correspondence with the exposure conditions.

When the arc shape of the slit opening portion 9a is set, the illumination distribution control circuit 33 controls the condencer lenses 6a and 6b, and deflector units 7 and 8, so that the electron beam 5 that scans the slit opening portion 9a has a scanning speed and irradiation intensity corresponding to the set arc shape of the slit opening portion 9a.

The arcuated electron beam band formed by the electron beam illumination device 2 projects a circuit pattern formed on the mask 18 and images it on the wafer 32, thus exposing the wafer 32. At this time, the mask stage 21 and wafer stage 30 synchronously move to have a speed difference corresponding to the reduction magnification of the reduction electron optical system 20, thereby transferring the entire circuit pattern formed on the mask 18 onto the wafer 32 by exposure.

Figure 12:
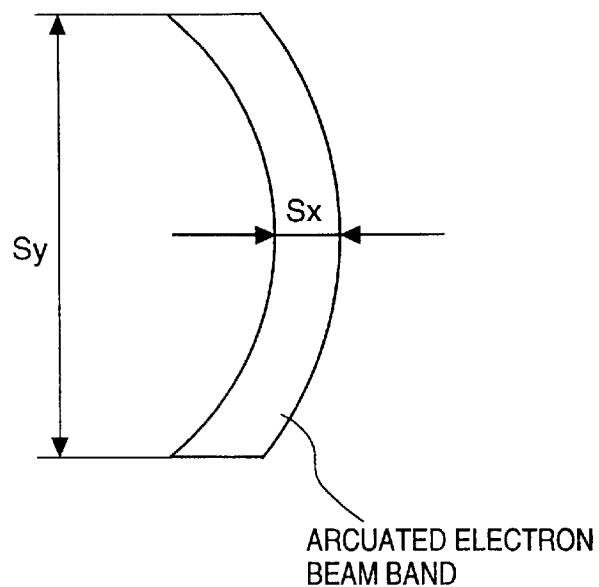
FIG. 12 is a top view showing the exposure region of an arcuated electron beam band projected onto the wafer.

FIG. 12 is a top view showing the exposure region of the arcuated electron beam band projected onto the wafer. Note that Sx in FIG. 12 indicates the arc width of the arcuated electron beam band, and Sy indicates its length. The arc width Sx and band length Sy of the arcuated electron beam band formed by the exposure apparatus 1 of this embodiment can be adjusted respectively within the range from about 0.01 mm to 1 mm and the range from about 1 mm to 10 mm by moving the blades 12, 13, 15, and 16 (see FIG. 4).

Figure 13:
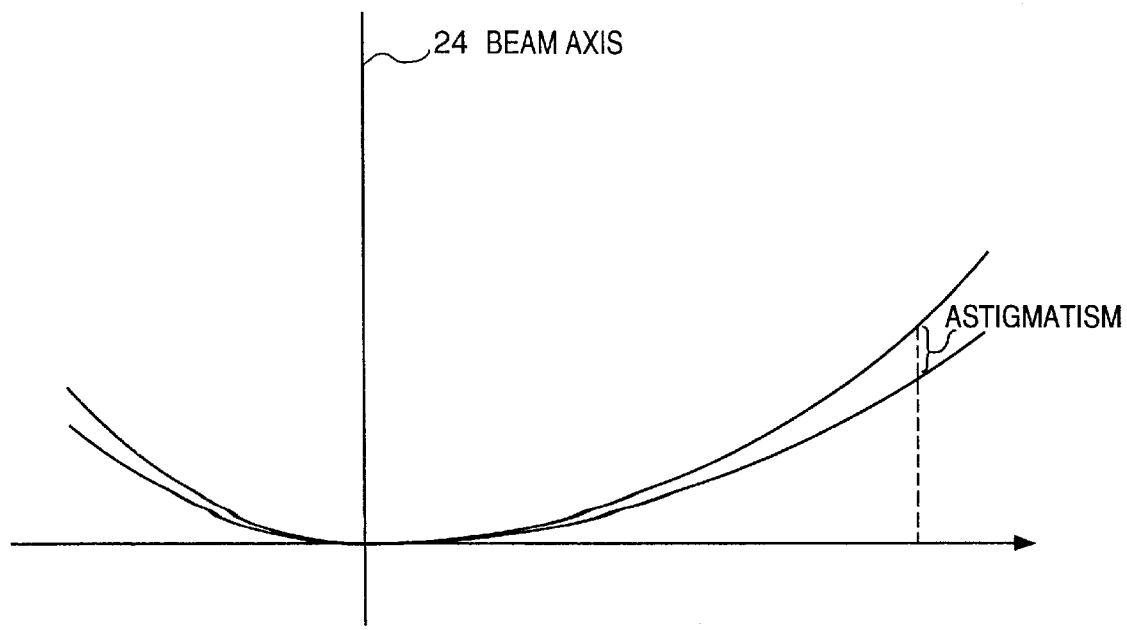
FIG. 13 is a graph showing the relationship between the distance of a pattern image projected onto the wafer from the beam axis, and astigmatism.

In general, a pattern image projected onto the wafer suffers larger aberrations (especially, curvature of field, astigmatism) with increasing distance from the beam axis. However, as shown in FIG. 1, since the arcuated electron beam band formed by the electron beam illumination device 2 of this embodiment is defined by the electron beam 5 that has been scanned to have the beam axis 24 as the center, the distance from the beam axis 24 is constant. For this reason, the curvature of field of the pattern image is negligibly small. Also, as shown in FIG. 13, the influences of astigmatism become larger with increasing distance from the beam axis 24. However, since such influences are negligible, the influences of astigmatism can be removed by correcting the astigmatism using the aberration correction optical system 23 shown in FIG. 6. Consequently, the pattern image (i.e., the exposure region) to be projected onto the wafer 32 can be broader than that formed by a conventional electron beam method, the influences of aberrations can be removed, and the electron beam 5 can have uniform irradiation intensity.

Note that the cycle of the electron beam 5 that scans the slit opening portion 9a is preferably a cycle which is shorter than the moving time of the mask 18 by a distance equal to the arc width of the arcuated electron beam band irradiated onto the mask 18, and is a divisor of the moving time. With this cycle, exposure errors such as formation of non-exposed portions, double exposure, and the like can be prevented, and the wafer 32 can be uniformly exposed.

Since the projection device 3 comprises the first electron detector 22 for detecting secondary electrons or the like emitted by the mask 18 irradiated with the electron beam 5, whether or not a circuit pattern is formed on a portion of the mask 18 irradiated with the electron beam 5 can be recognized by detecting such secondary electrons. Furthermore, since the electron beam illumination device 2 comprises the blanking electrode 10 for controlling irradiation of the electron beam 5 onto the mask 18 as needed on the basis of the information supplied from the first electron detector 22, when the electron beam is irradiated onto a portion where no circuit pattern is formed of the mask 18, the blanking electrode 10 is activated to suppress wasteful irradiation of the electron beam 5, thereby preventing thermal strain of the mask 18.

Figure 14:
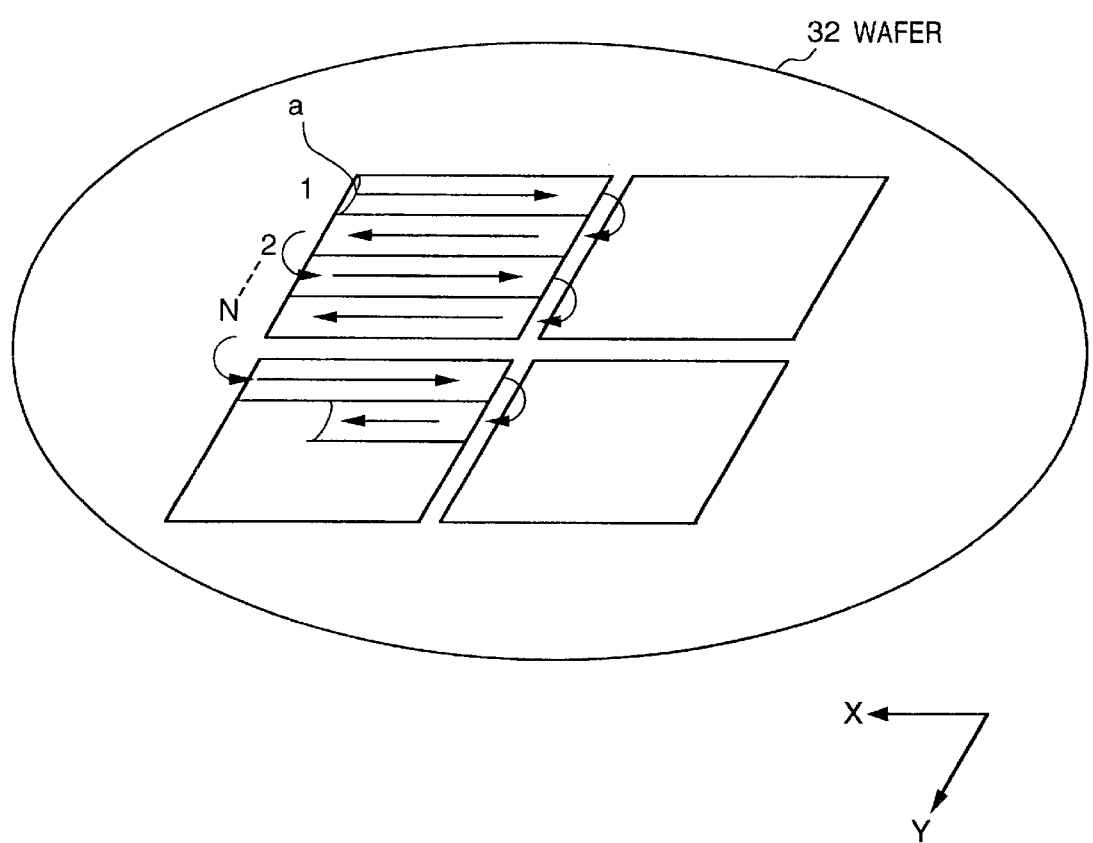
FIG. 14 is a perspective view showing an exposure route when the projected pattern image exposes the wafer.

FIG. 14 is a perspective view showing the exposure route when the pattern image (exposure region) exposes the wafer. Four chips each having a size of 35 mm (X-direction)×20 mm (Y-direction) are to be formed on the wafer 32 shown in FIG. 14.

Before the beginning of exposure, the length (Y-size) of the arcuated pattern image on the wafer 32 is set at 5 mm. In this case, the number of exposure scans is four since 20 mm/5 mm=4. When exposure is started from the position of arc a in FIG. 14, the wafer stage 21 and mask stage 30 (see FIG. 1) are synchronously moved in the X-direction, and when arc a has reached the right end of a chip region, the first scan is complete. Upon completion of the first scan, the wafer stage 30 and mask stage 21 are moved in the Y-direction at step widths of 5 mm and 20 mm, respectively, thereby setting arc a at the second scan start position. Subsequently, the second scan is started by synchronously moving the wafer stage 30 and mask stage 20 in a direction opposite to that in the first scan. By repeating the above operation, exposure for one chip is completed after a total of four scans. When such exposure operation is repeated for four chips, exposure for one wafer is complete.

In the above description, the step width of the wafer stage 21 is 5 mm, while that of the mask stage 30 is 20 mm, since the reduction magnification of the reduction electron optical system 20 (see FIG. 1) in the projection device 3 is ¼. However, the reduction magnification of the reduction electron optical system 20 of this embodiment is not limited to ¼, and can be arbitrarily set at about ¼ to ½. Depending on this setup, the step width of the mask stage 21 varies.

As described above, since the exposure apparatus 1 of this embodiment uses the above-mentioned electron beam illumination device 2 and exposes the wafer 32 by scanning the broadened exposure region, the number of exposure scans onto the wafer 32 can be greatly reduced and the exposure time can be shortened as compared to those of a conventional exposure apparatus using a single electron beam.

Also, since the exposure apparatus 1 comprises the first laser interferometer 36 for detecting the position of the mask stage 21 and the second laser interferometer 41 for detecting the position of the wafer stage 30, as has been described above with the aid of FIG. 7, any positional deviations of the mask stage 21 and wafer stage 30 from their original positions can be detected. Furthermore, since the projection device 3 comprises the position correction deflector 27 for correcting the position of the pattern image to be projected onto the wafer 32, as shown in FIG. 1, even when the mask stage and wafer stage deviate from their original positions, the pattern image can be projected onto the original position by the position correction deflector 27.

In a normal exposure process, the circuit pattern on the mask is overlay-exposed on the circuit pattern formed in advance on the wafer. In this case, the patterns must overlap each other with high accuracy. However, when the pattern is formed on the wafer, the wafer must undergo a film formation process. Since the wafer has expanded or shrunk after the film formation process, even when the projection pattern formed on the mask is projected onto the wafer at an original reduction factor, the patterns cannot overlap each other with high accuracy. For this reason, the control system 44 (see FIG. 7) acquires the expansion/shrinkage ratio of the wafer 32 in advance, and adjusts the reduction magnification of the reduction electron optical system 20 via the magnification control circuit 39 (see FIG. 7) on the basis of the expansion/shrinkage ratio. At the same time, the control system 44 changes the setups of the wafer stage drive control circuit 41 so that the wafer stage 30 moves at a speed corresponding to the adjusted reduction magnification of the reduction electron optical system 20, and also changes the step width of the wafer stage 30.

Figure 15:
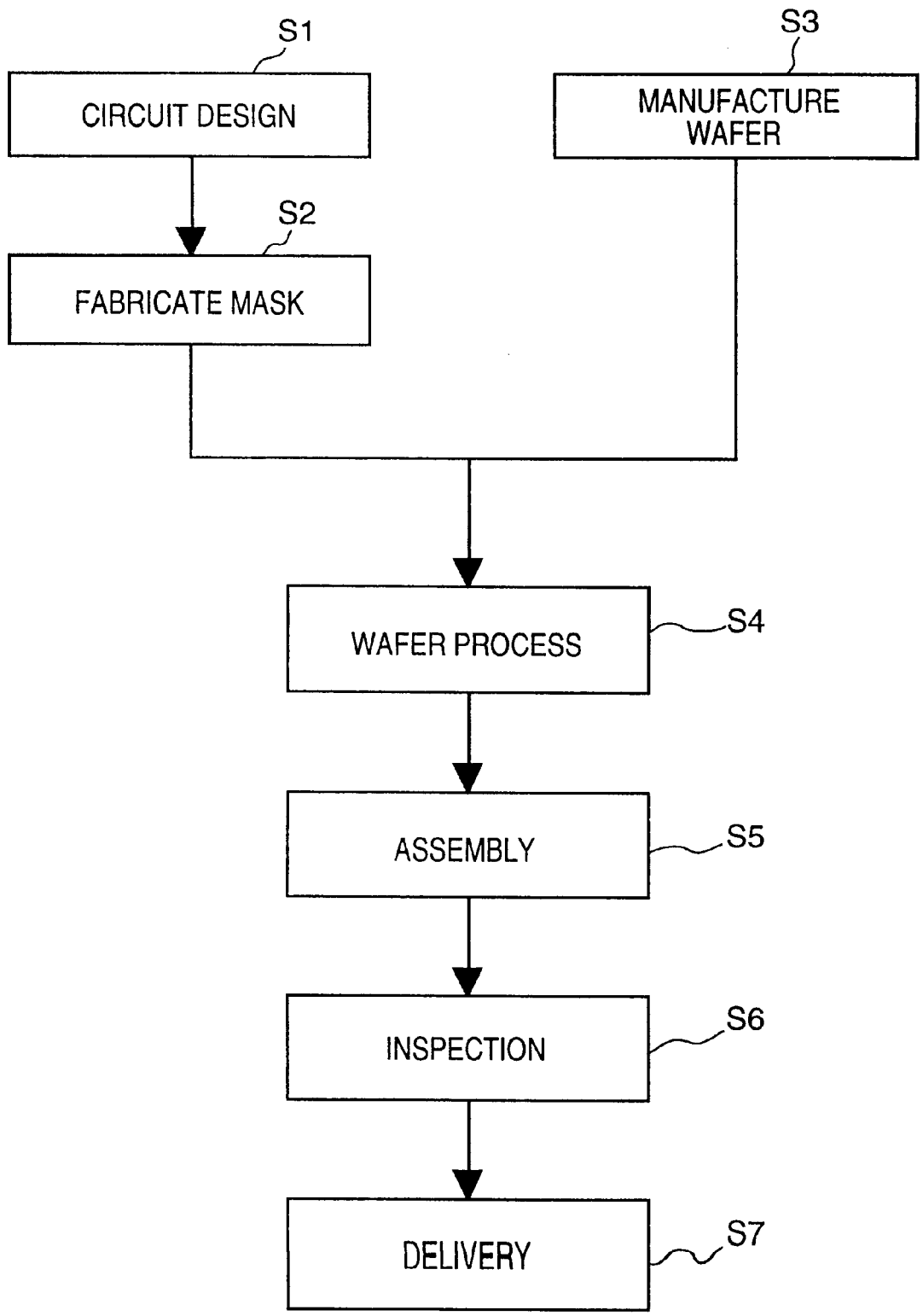
FIG. 15 is a flow chart showing the manufacturing processes of a microdevice.

An embodiment of the manufacturing method of semiconductor devices using the above-mentioned exposure apparatus will be explained below. FIG. 15 shows the flow in the manufacture of a microdevice (semiconductor chips such as ICs, LSIs, and the like, liquid crystal panels, thin film magnetic heads, micromachines, and the like). In step 1 (circuit design), the circuit design of a semiconductor device is made. In step 2 (manufacture mask), a mask formed with a designed circuit pattern is manufactured. In step 3 (fabricate wafer), a wafer is fabricated using materials such as silicon and the like. Step 4 (wafer process) is called a pre-process, and an actual circuit is formed by lithography using the prepared mask and wafer. The next step 5 (assembly) is called a post-process, in which semiconductor chips are assembled using the wafer obtained in step 4, and includes an assembly process (dicing, bonding), a packaging (encapsulating chips), and the like. In step 6 (inspection), inspections such as operation confirmation tests, durability tests, and the like of semiconductor devices assembled in step 5 are run. Semiconductor devices are completed via these processes, and are delivered (step 7).

Figure 16:
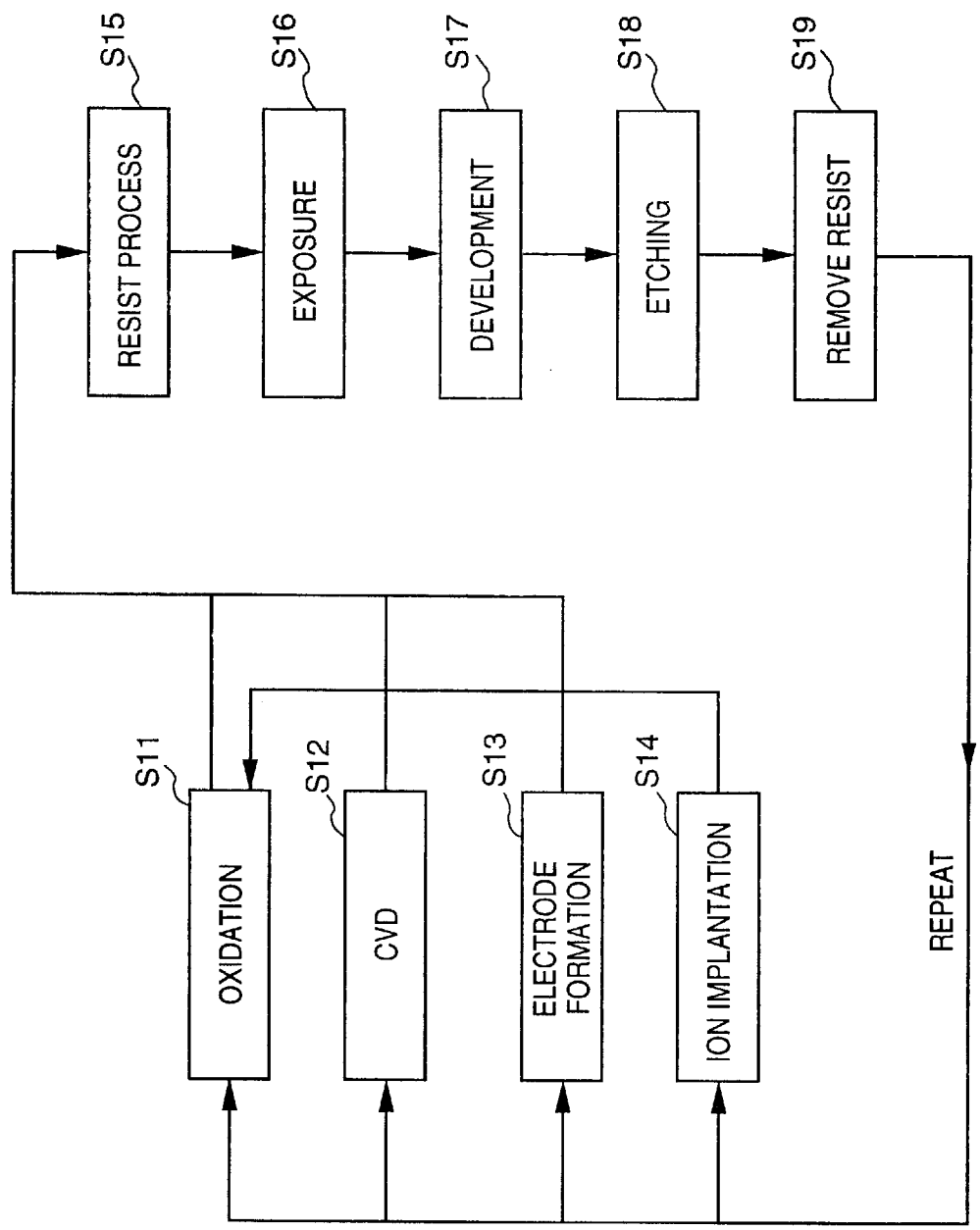
FIG. 16 is a flow chart showing the detailed processes of a wafer process shown in FIG. 15.
Figure 17:
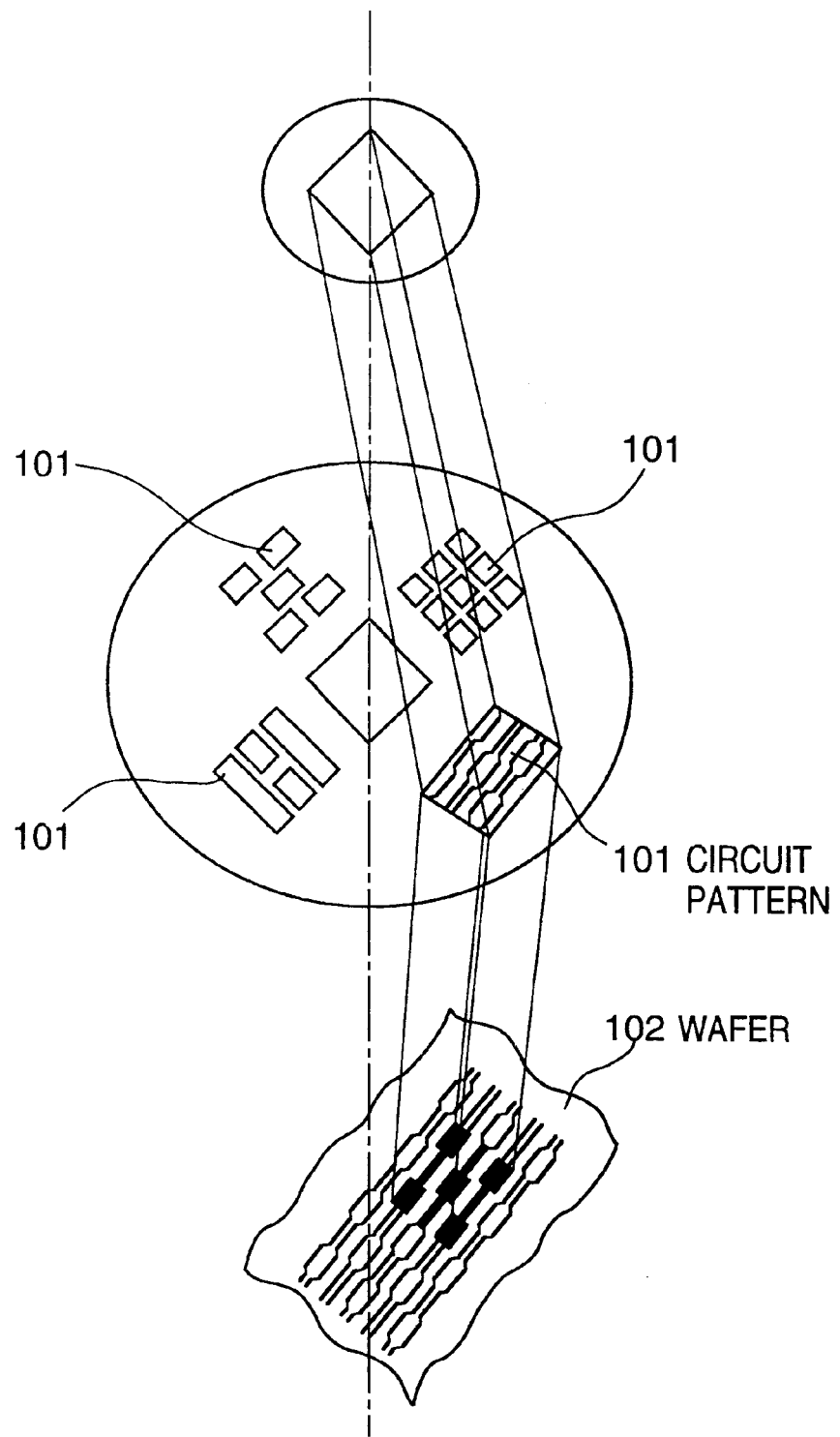
FIG. 17 is a perspective view showing an exposure apparatus using conventional stepping exposure.

FIG. 16 is a flow chart showing the wafer process in detail. In step 11 (oxidation), the surface of the wafer is oxidized. In step 12 (CVD), an insulating film is formed on the wafer surface. In step 13 (electrode formation), electrodes are formed by deposition on the wafer. In step 14 (ion implantation), ions are implanted into the wafer. In step 15 (resist process), a photosensitive agent is applied on the wafer. In step 16 (exposure), the circuit pattern on the mask is printed on the wafer by exposure using the above-mentioned exposure apparatus. In step 17 (development), the exposed wafer is developed. In step 18 (etching), a portion other than the developed resist image is removed by etching. In step 19 (remove resist), the resist film which has become unnecessary after the etching is removed. By repetitively executing these steps, multiple circuit patterns are formed on the wafer. When the manufacturing method of this embodiment is used, the exposure time of the circuit pattern formed on the mask onto the wafer can be shortened, and the productivity of semiconductor devices can be improved.

As described above, since an electron beam illumination device of the present invention comprises an electron gun, a slit plate unit formed with an arcuated slit opening portion, and deflection means for scanning an electron beam along the slit opening portion, the electron beam irradiation region on the mask, and the exposure region on the wafer can be broadened, and the electron beam can be irradiated onto these regions at uniform irradiation intensity.

As the speed of the electron beam that scans the slit opening portion makes the irradiation intensity of an arcuated electron beam band uniform in the entire arcuated electron beam band, thermal strain produced in the mask and wafer upon scanning of the electron beam can be eliminated.

Furthermore, the slit plate unit has convex and concave blades, the arcuated edge portions of which oppose each other so as to form a slit opening portion. Furthermore, a drive unit for adjusting the spacing between the blades is attached to at least one of the blades, thus adjusting the arc width of the arcuated electron beam band. By controlling the arc width, the irradiation intensity of the arcuated electron beam band can be adjusted, and the resolution of the pattern image can also be adjusted.

In addition, since the slit plate unit has a light-shielding blade for adjusting the length of the slit opening portion defined by the convex and concave blades, the arc length of the arcuated electron beam band can be adjusted, and can be optimally set in correspondence with the size of the region to be exposed.

Furthermore, since the center of rotation or reciprocal movement of the electron beam that scans the slit opening portion is shifted from the center of the slit opening portion along the central axis of the slit opening portion by the deflection means, the arc width of the arcuated electron beam band can be reduced, thus adjusting the arc width of the arcuated electron beam band.

Since an exposure apparatus of the present invention uses the electron beam illumination device of the present invention as an illumination device for projecting a circuit pattern onto a wafer, the wafer can be exposed by scanning the broadened exposure region. Hence, the number of exposure scans onto the wafer can be reduced, and the exposure time can be shortened.

Since the scanning cycle of the electron beam onto the slit opening portion is set at a cycle which is shorter than the moving time of the mask by a distance equal to the width of the arcuated electron beam band projected onto the mask, and is a divisor of the moving time, exposure errors such as formation of non-exposed portions, double exposure, and the like of the wafer can be prevented.

The exposure apparatus comprises an electron detection unit for detecting electrons emitted by the mask irradiated with the electron beam, and a blanking electrode unit that controls irradiation of the electron beam onto the mask on the basis of information obtained from the electron detection unit. Therefore, wasteful irradiation of the electron beam can be suppressed, and thermal strain of the mask can be prevented.

Moreover, since the exposure apparatus comprises mask and wafer reference mark detection means, the mask and wafer can be accurately aligned to the beam axis of the electron beam illumination device.

The present invention is not limited to the above embodiment and various changes and modifications can be made within the spirit and scope of the present invention. Therefore, to appraise the public of the scope of the present invention, the following claims are made.

What is claimed is:

1. An electron beam illumination device comprising:

an electron gun for emitting an electron beam;

a slit plate unit formed with an arcuated slit opening portion which has as the center an extending line of a path of the electron beam emitted by said electron gun; and deflection means for scanning the electron beam along said slit opening portion by deflecting the electron beam emitted by said electron gun before the electron beam is irradiated onto said slit plate unit, and rotating or reciprocally moving the electron beam to have as the center the extending line of the path of the electron beam.

2. The device according to claim 1, wherein a speed of the electron beam that scans the slit opening portion is a speed which makes an irradiation intensity of an arcuated electron beam band formed when the electron beam has passed through said slit opening portion uniform in the entire arcuated electron beam band.

3. The device according to claim 1, wherein said slit plate unit comprises a convex blade formed with an arcuated convex edge, and a concave blade formed with an arcuated concave edge having the same diameter as a diameter of the convex edge, said slit opening portion is defined by disposing said convex and concave blades with the arcuated edges thereof opposing each other, and at least one of said convex and concave blades comprises a drive unit for adjusting a spacing between said convex and concave blades.

4. The device according to claim 2, wherein said slit plate unit comprises a convex blade formed with an arcuated convex edge, and a concave blade formed with an arcuated concave edge having the same diameter as a diameter of the convex edge, said slit opening portion is defined by disposing said convex and concave blades with the arcuated edges thereof opposing each other, and at least one of said convex and concave blades comprises a drive unit for adjusting a spacing between said convex and concave blades.

5. The device according to claim 3, wherein said slit plate unit further comprises a light-shielding blade for adjusting a length of said slit opening portion defined by said convex and concave blades.

6. The device according to claim 4, wherein said slit plate unit further comprises a light-shielding blade for adjusting a length of said slit opening portion defined by said convex and concave blades.

7. The device according to claim 5, wherein the center of rotation or reciprocal movement of the electron beam that scans said slit opening portion is shifted from the center of said slit opening portion along the central axis of said slit opening portion by said deflection means.

8. The device according to claim 6, wherein the center of rotation or reciprocal movement of the electron beam that scans said slit opening portion is shifted from the center of said slit opening portion along the central axis of said slit opening portion by said deflection means.

9. An exposure apparatus which comprises an illumination device for illuminating a mask to project a circuit pattern formed on said mask onto a wafer, and projects the circuit pattern onto said wafer by exposure while synchronously moving said wafer and mask, using an electron beam illumination device of claim 7 as said illumination device.

10. An exposure apparatus which comprises an illumination device for illuminating a mask to project a circuit pattern formed on said mask onto a wafer, and projects the circuit pattern onto said wafer by exposure while synchronously moving said wafer and mask, using an electron beam illumination device of claim 8 as said illumination device.

11. The apparatus according to claim 9, wherein a scanning cycle of the electron beam onto said slit opening portion is a cycle which is shorter than a moving time of said mask by a distance equal to a width of the arcuated electron beam band when the arcuated electron beam band formed by the electron beam that has passed through said slit opening portion is projected onto said mask, and is a divisor of the moving time.

12. The apparatus according to claim 10, wherein a scanning cycle of the electron beam onto said slit opening portion is a cycle which is shorter than a moving time of said mask by a distance equal to a width of the arcuated electron beam band when the arcuated electron beam band formed by the electron beam that has passed through said slit opening portion is projected onto said mask, and is a divisor of the moving time.

13. The apparatus according to claim 11, further comprising:

an electron detection unit for detecting an electron emitted by said mask irradiated with the electron beam; and a blanking electrode unit for controlling irradiation of the electron beam onto said mask on the basis of information obtained from said electron detection unit.

14. The apparatus according to claim 12, further comprising:

an electron detection unit for detecting an electron emitted by said mask irradiated with the electron beam; and a blanking electrode unit for controlling irradiation of the electron beam onto said mask on the basis of information obtained from said electron detection unit.

15. The apparatus according to claim 13, further comprising:

mask reference mark detection means for detecting a position reference mark formed on said mask; and wafer reference mark detection means for detecting a position reference mark formed on said wafer.

16. The apparatus according to claim 14, further comprising:

mask reference mark detection means for detecting a position reference mark formed on said mask; and wafer reference mark detection means for detecting a position reference mark formed on said wafer.

* * * * *

UNITED STATES PATENT AND TRADEMARK OFFICE
CERTIFICATE OF CORRECTION

PATENT NO. : 6,037,601

DATED : March 14, 2000

INVENTOR(S): MASAHIKO OKUNUKI

It is certified that error appears in the above-identified patent and that said Letters Patent is hereby corrected as shown below:

COVER PAGE AT ITEM [57] ABSTRACT:
Line 10, "at" should read --at a--.

COLUMN 1:
Line 29, "in" should read --in a--; and
Line 34, "years," should read --years, a--.

COLUMN 2:
Line 12, "of" should read --of an--;
Line 13, "such" should read --such a--; and
Line 37, "such" should read --such an--.

COLUMN 4:
Line 15, "atop" should read --a top--;
Line 19, "of" should read --of a--; and
Line 50, "embodiment" should read --embodiments--.

COLUMN 5:
Line 1, "condencer" should read --condenser--;
Line 13, "condencer" should read --condenser--;
Line 14, "condencer" should read --condenser--; and
Line 31, "condencer" should read --condenser--.

UNITED STATES PATENT AND TRADEMARK OFFICE
CERTIFICATE OF CORRECTION

PATENT NO. : 6,037,601

DATED : March 14, 2000

INVENTOR(S): MASAHIKO OKUNUKI

It is certified that error appears in the above-identified patent and that said Letters Patent is hereby corrected as shown below:

COLUMN 7:
Line 6, "of" should read --of a--;
Line 11, "condencer" should read --condenser--; and
Line 46, "condencer" should read --condenser--.

COLUMN 8:
Line 7, "condencer" should read --condenser--;
Line 27, "at" should read --at a--;
Line 44, "such" should read --such a--; and
Line 54, "condencer" should read --condenser--.

COLUMN 9:
Line 21, "condencer" should read --condenser--; and
Line 62, "have" should read --have a--.

COLUMN 10:
Line 41, "such" should read --such an--.

COLUMN 11:
Line 41, "packaging" should read --packaging process--.

UNITED STATES PATENT AND TRADEMARK OFFICE
CERTIFICATE OF CORRECTION

PATENT NO. : 6,037,601

DATED : March 14, 2000

INVENTOR(S): MASAHIKO OKUNUKI

It is certified that error appears in the above-identified patent and that said Letters Patent is hereby corrected as shown below:

<u>COLUMN 12</u>:
Line 8, "at" should read --at a--.

Signed and Sealed this

Twenty-seventh Day of March, 2001

*Attest:*

NICHOLAS P. GODICI

*Attesting Officer*  Acting Director of the United States Patent and Trademark Office